(12) United States Patent
Gaudet

(10) Patent No.: US 6,529,571 B1
(45) Date of Patent: Mar. 4, 2003

(54) METHOD AND APPARATUS FOR EQUALIZING PROPAGATION DELAY

(75) Inventor: Brian C. Gaudet, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/407,735

(22) Filed: Sep. 28, 1999

(51) Int. Cl.[7] ................................................. H04L 7/06
(52) U.S. Cl. ....................... 375/363; 375/355; 327/262; 327/395
(58) Field of Search .............................. 375/354, 359, 375/362, 363, 371, 373; 327/261, 262, 263, 284, 392, 393, 395, 400, 141, 147, 152, 158, 161, 264, 270, 276; 370/503, 517, 519

(56) References Cited

U.S. PATENT DOCUMENTS

| | | | | |
|---|---|---|---|---|
| 5,432,823 A | * | 7/1995 | Gasbarro et al. | 370/507 |
| 5,452,324 A | * | 9/1995 | Lewis et al. | 327/395 |
| 5,790,612 A | * | 8/1998 | Chengson et al. | 327/148 |
| 6,144,713 A | * | 11/2000 | Eto | 327/161 |
| 6,205,191 B1 | * | 3/2001 | Portmann et al. | 327/152 |
| 6,289,068 B1 | * | 9/2001 | Hassoun et al. | 327/156 |

* cited by examiner

Primary Examiner—Chi Pham
Assistant Examiner—Khanh Tran
(74) Attorney, Agent, or Firm—Girard & Equitz LLP

(57) ABSTRACT

An apparatus for and method of generating a signal for equalizing propagation delay among parts of a transceiver are disclosed. The parts each have a plurality of channels, and each channel is configured to receive the signal. The apparatus includes a master circuit and a dummy channel circuit. The master circuit is configured to receive and lock to a reference clock signal, and in accordance therewith generate a reference delay signal and an adjusted clock signal. The dummy channel circuit is configured to receive the adjusted clock signal, the reference delay signal and a dummy data signal, and in accordance therewith generate an intermediate data signal, the dummy data signal and one or more control signals. The control signals correspond to a delay between the adjusted clock signal and the intermediate data signal. In this manner a uniform delay may be provided to all parts and channels.

24 Claims, 6 Drawing Sheets

METHOD AND APPARATUS FOR EQUALIZING PROPAGATION DELAY

BACKGROUND OF THE INVENTION

1. Field of the Invention

The present invention relates to circuits used for equalizing propagation delays of signals in a circuit. In particular, the invention relates to the use of delay-locked loops to equalize propagation delays.

2. Description of the Related Art

A data switch may be implemented with a number of channels for transmitting data. The channels may be grouped into a number of parts. However, variations in the fabrication process, operating voltages, and operating temperature of the various parts can undesirably increase signal skew between channels. This problem increases with the number of parts.

In other instances it is desirable to limit the number of channels implemented on each part. For example, for the DP83890 Private Data Exchange (PDX) from National Semiconductor Corp., Santa Clara, Calif. it was desired to integrate no more than 9 channels on a single part. (For example, eight channels for data and one channel for a clock signal.) A solution was needed to ensure that propagation delays through any N parts on printed circuit board would be substantially equal, to minimize skew between channels (e.g., 24 channels on three parts for the PDX). Otherwise there is no sampling eye at the receiver when a printed circuit board has both a fast part and a slow part on it.

SUMMARY OF THE INVENTION

The present invention addresses these and other problems of the prior art by providing an apparatus for and method of equalizing propagation delay.

According to one embodiment, an apparatus according to the present invention includes a circuit for generating a signal for equalizing propagation delay among parts of a transceiver. The parts each having a plurality of channels, with each channel being configured to receive the signal. The apparatus comprises a master circuit and a dummy channel circuit. The master circuit is configured to receive and lock to a reference clock signal and in accordance therewith generate a reference delay signal and an adjusted clock signal. The dummy channel circuit is configured to receive the adjusted clock signal, the reference delay signal and a dummy data signal, and in accordance therewith generate an intermediate data signal, the dummy data signal and one or more control signals. The one or more control signals correspond to a delay between the adjusted clock signal and the intermediate data signal.

According to another embodiment, a method according to the present invention equalizes propagation delay among parts of a transceiver. The parts each have a plurality of channels, with each channel being configured to receive a signal for setting a delay period. The method includes the steps of receiving and locking to a reference clock signal; and generating a reference delay signal and an adjusted clock signal, in accordance with the step of receiving and locking. The method further includes the step of receiving the adjusted clock signal, the reference delay signal and a dummy data signal. The method still further includes the step of generating an intermediate data signal, the dummy data signal and one or more control signals, in accordance with the step of receiving the adjusted clock signal, wherein the one or more control signals correspond to a delay between the adjusted clock signal and the intermediate data signal.

A better understanding of the features and advantages of the present invention will be obtained by reference to the following detailed description and accompanying drawings which set forth illustrative embodiments in which the principles of the invention are utilized.

DETAILED DESCRIPTION OF THE PREFERRED EMBODIMENTS

In a preferred embodiment, this invention uses delay locked loops (DLLs) to calibrate two dummy channels (a receive and a transmit channel) such that the delay is maintained at a substantially constant value, regardless of process, voltage, and temperature variations. A variable delay stage in each channel is biased off of the DLL control current in the dummy channel. A dummy channel is used so that the part could lock to the precision delay even without any data input.

A DLL can be used to ensure that the delay from transistor-transistor logic (TTL) input to low-voltage differential signaling (LVDS) output and LVDS input to TTL output is constrained within a small time period (e.g., 400 ps) across all channels across variations in process, voltage, and temperature. This uses dummy transmission and receive channels with primary inputs and outputs, and a high speed input buffer for sensing input signals and output signals on the dummy channels. On board, the dummy channel output has a dummy load which matches that of the other channels. A dedicated output for sourcing the calibration clock is also used.

In one embodiment, the LVDS driver has an onboard DLL that takes a 25 MHz reference clock and creates eight evenly spaced phases of 25 MHz. One of these phases is the input to the dummy channels, then the next phase (delayed 5 ns) is compared to the sense output for the channel. These go into a phase comparator of the second DLL, which locks when the channel propagation delay is 5 ns. The phase comparator output goes to a digital filter, which decodes a value used to turn on binary weighted capacitors in a variable delay stage inserted in the data path. This delay stage is slaved to the active channels.

The delay calibration circuit ensures that the delays through the transmit and receive sides of an LVDS transceiver are substantially the same as the delays through the transmit and receive sides of other LVDS transceiver integrated circuits on the same printed circuit board, even if they are the results of different fabrication processes, have different operating voltages, or have different operating temperatures. Of course on a printed circuit board it is expected that operating voltages and temperatures will be very similar for all integrated circuits, so fabrication process variation is the biggest factor.

Figure 1:
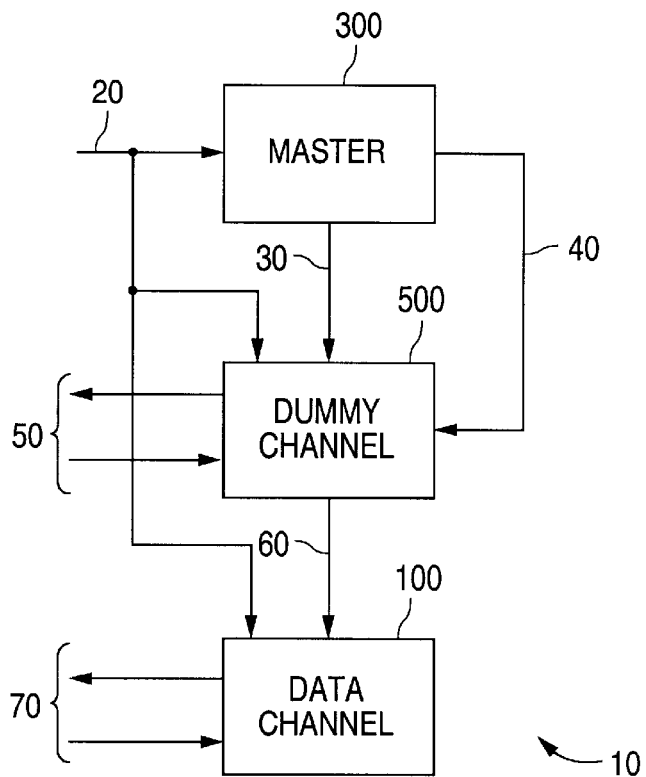
FIG. 1 is a block diagram of a propagation delay equalizer circuit according to the present invention.

FIG. 1 illustrates the three general components of a propagation delay equalizer circuit 10. Circuit 10 includes master circuit 300, dummy channel circuit 500, and data channel circuit 100. Master circuit 300 receives reference clock signal 20 and outputs adjusted clock signal 30 and reference delay signal 40. Dummy channel circuit 500 receives reference clock signal 20, adjusted clock signal 30 and reference delay signal 40, and outputs dummy data signal 50 and equalization delay signal 60. Data channel circuit 100 receives reference clock signal 20 and equalization delay signal 60, and outputs data signal 70.

As discussed in more detail below, dummy channel 500 sends dummy data signal 50 and equalizes a delay of dummy data signal 50 until the delay matches reference delay signal 40. Dummy channel 500 then identifies the delay to data channel 100 via equalization delay signal 60. Data channel 100 then adjusts a delay of data signal 70 until such delay matches that represented by equalization delay signal 60. In this manner, a plurality of data channels can send and receive data signals with uniform delays.

Figure 2:
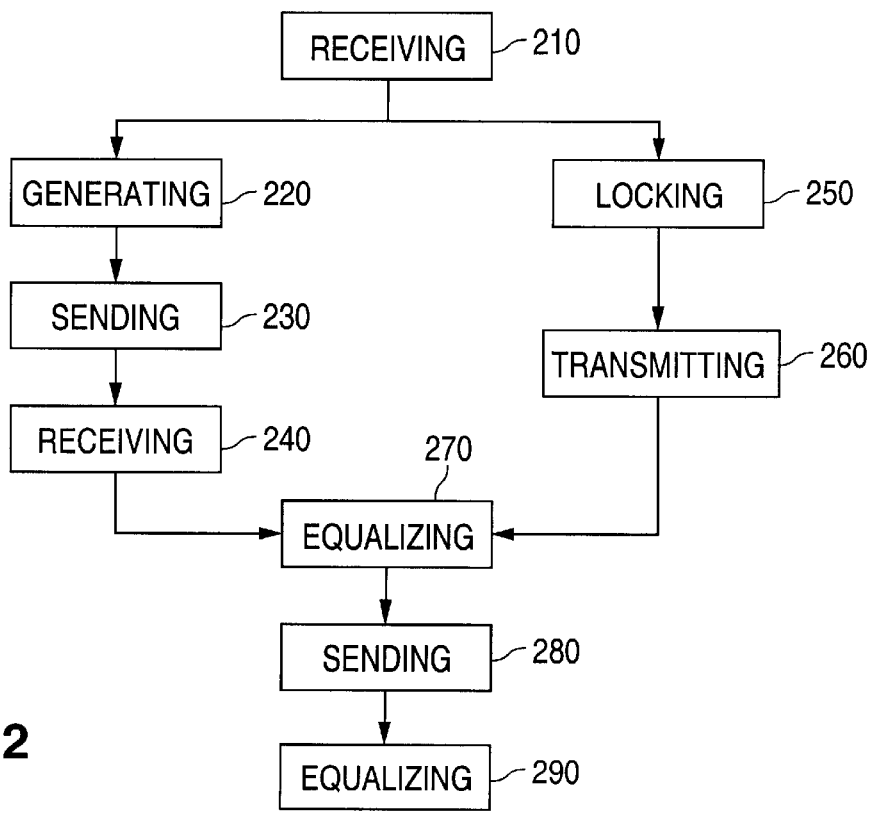
FIG. 2 is a flowchart of the process performed by the propagation delay equalizer circuit.

FIG. 2 illustrates the operations performed by propagation delay equalizer circuit 10. Circuit 10 receives reference clock signal 20 in receiving state 210. Circuit 10 then generates adjusted clock signal 30 in generating state 220, sends dummy data signal 50 in sending state 230, and receives dummy data signal 50 in receiving state 240. Also after receiving state 210, circuit 10 locks to reference clock signal 20 in locking state 250 and transmits reference delay signal 40 in transmitting state 260. After receiving state 240 and transmitting state 260, circuit 10 equalizes a delay of dummy data signal 50 with reference delay signal 40 in equalizing state 270. Then, circuit 10 sends equalization delay signal 60, based on a result of the equalization, in sending state 280. Then, circuit 10 equalizes a delay of data signal 70 based on equalization delay signal 60 in equalizing state 290.

Figure 3A:
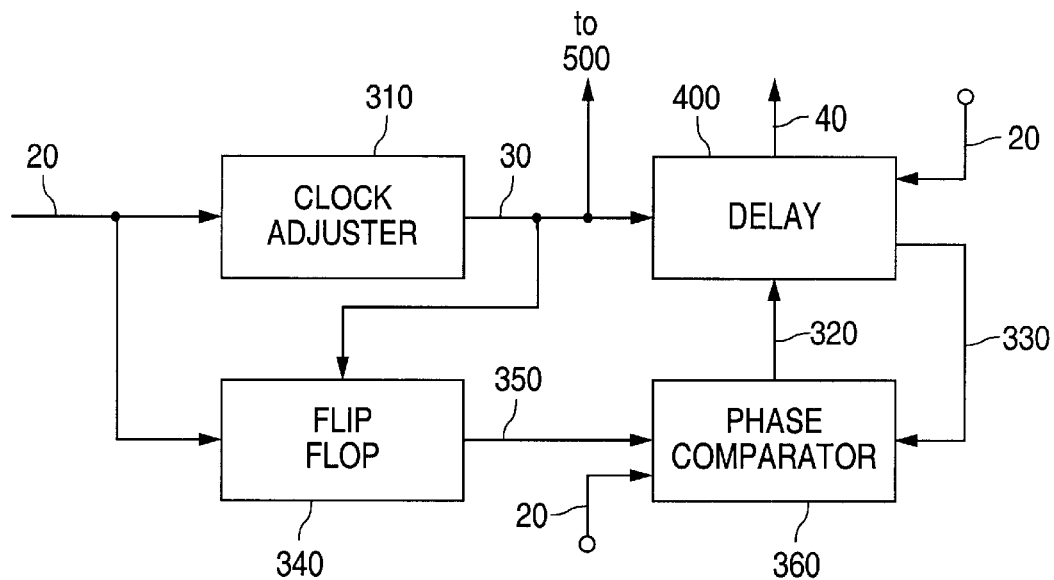
FIG. 3A is a block diagram of a master circuit in the propagation delay equalizer circuit.

FIG. 3A illustrates the circuits in master circuit 300. Circuit 300 includes clock adjuster circuit 310, delay circuit 400, flip flop circuit 340, and phase comparator circuit 360.

Clock adjuster circuit 310 receives reference clock signal 20 and outputs adjusted clock signal 30. As implemented, reference clock signal 20 runs at 25 MHz; however, other frequencies may be used as desired. Preferably the clock adjuster circuit 310 is a clock divider circuit (e.g., a flip-flop) and the adjusted clock signal 30 may be the reference clock signal 20 divided by eight to 3.125 MHz. A frequency different than that of reference clock signal 20 ensures that master circuit 300 does not lock to a multiple of the reference delay. Specifically, the phase comparator circuit 360 cannot detect a phase difference of above 180 degrees. In a case where the timing variation is greater than half of the period of the reference clock signal 20 (greater than, e.g., 20 ns), the detected phase difference would be inaccurate. Calculating the phase difference from the adjusted clock signal 30, with a period greater than that of the reference clock signal 20, results in a more accurate phase difference that may be detected.

Delay circuit 400 receives adjusted clock signal 30 and master delay signal 320, outputs delayed adjusted clock signal 330 based on adjusted clock signal 30 and master delay signal 320, and outputs reference delay signal 40 based on delayed adjusted clock signal 330. Flip flop circuit 340 receives reference clock signal 20 and adjusted clock signal 30, and outputs flip flop clock signal 350. Phase comparator circuit 360 receives flip flop clock signal 350 and delayed adjusted clock signal 330, and outputs master delay signal 320 to delay circuit 400.

Reference delay signal 40 is generated as follows. Flip flop circuit 340 is clocked by reference clock signal 20, generating flip flop clock 350, which is adjusted clock signal 30 delayed by the period of reference clock signal 20. For example, when reference clock signal 20 is 25 MHz, flip flop clock signal 350 is adjusted clock signal 30 delayed by 40 ns.

Phase comparator 360 compares the phases of flip flop clock signal 350 and delayed adjusted clock signal 330. It generates master delay signal 320 to indicate whether delayed adjusted clock signal 330 matches flip flop clock signal 350.

Delay circuit 400 adjusts a delay of adjusted clock signal 30 based on master delay signal 320, to produce delayed adjusted clock signal 330. It generates reference delay signal 40 based on the delay of delayed adjusted clock signal 330. For example, when delay circuit 400 includes eight similar subdelay stages and master delay signal 320 indicates that delayed adjusted clock signal 330 is in phase with flip flop clock signal 350 (period of 40 ns), reference delay signal 40 may be set at 10 ns by tapping the output of the second subdelay stage.

Figure 3B:
FIG. 3B is a timing diagram of the signals generated by the master circuit of FIG. 3A.
Figure 3B:
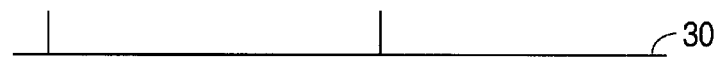
Figure 3B:
Figure 3B:
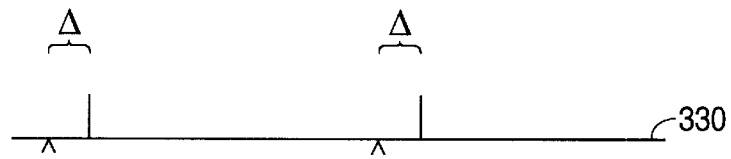
Figure 3B:
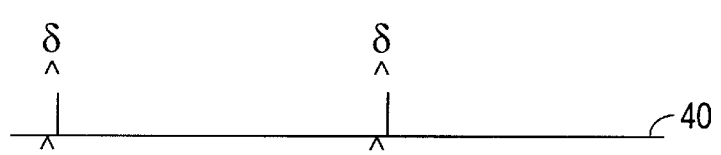

FIG. 3B illustrates the signals generated in a preferred implementation of master circuit 300. Reference clock signal 20 operates at 25 MHz. Adjusted clock signal 30 operates at 3.125 MHz. Flip flop clock signal 350 is adjusted clock signal 30 delayed by reference clock signal 20. That is, the flip flop clock signal 350 follows the adjusted clock signal 30 by a time delay Δ of 40 ns. Delayed adjusted clock signal 330 is adjusted clock signal 30 delayed by delay circuit 400. Thus the delayed adjusted clock signal 330 will also follow the adjusted clock signal 30 by a time delay Δ of 40 ns. Reference delay signal 40 is adjusted clock signal 30 delayed by less than all of the subdelay circuits in delay circuit 400 (see FIG. 4.). For example, the reference delay signal 40 follows the adjusted clock signal 30 by a time delay δ of 10 ns.

Figure 4:
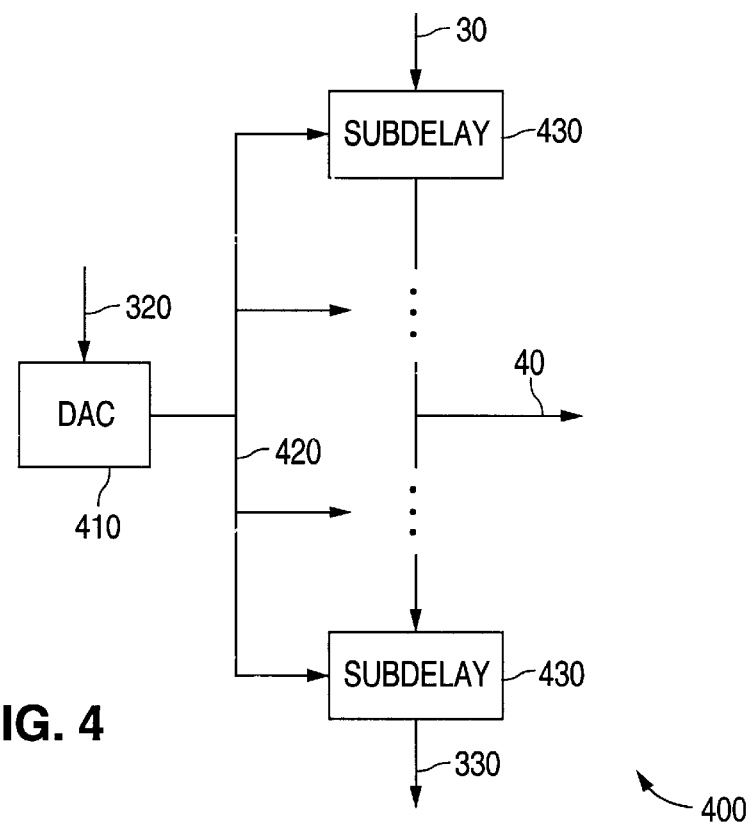
FIG. 4 is a block diagram of a delay circuit in the master circuit.

FIG. 4 illustrates a preferred implementation of delay circuit 400. Delay circuit 400 includes a digital-to-analog converter circuit 410 and a plurality of subdelay circuits 430. The DAC 410 provides analog master delay signal 420 to subdelay circuits 430. Reference delay signal 40 may be tapped off subdelay circuits 430 before the last subdelay circuit to give a delay less than the time delay Δ of delayed adjusted clock signal 330.

Preferably, phase comparator circuit 360 (see FIG. 3A) generates an 8-bit control word as master delay signal 320. The DAC 410 converts the control word into an analog current input to subdelay circuits 430. The DAC 410 preferably uses a bandgap reference current. Subdelay circuits 430 may be implemented as single-ended current starved buffers.

Figure 5:
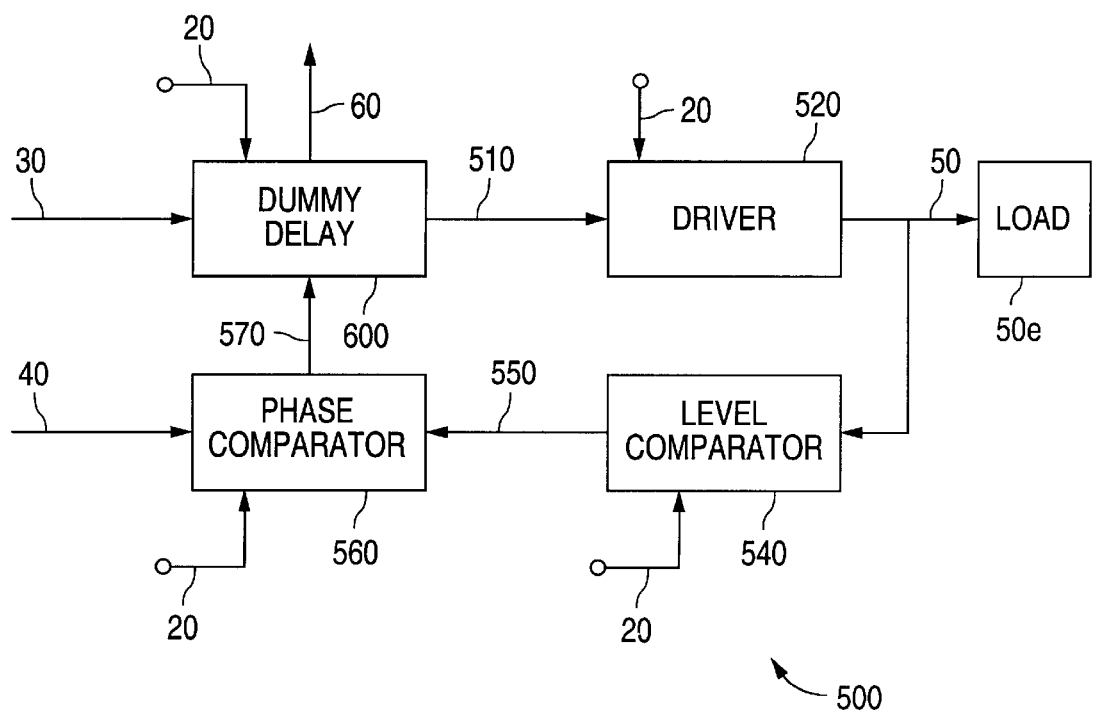
FIG. 5 is a block diagram of a dummy channel circuit in the propagation delay equalizer circuit.

FIG. 5 illustrates the components that make up dummy channel circuit 500. Circuit 500 includes dummy delay circuit 600, driver circuit 520, level comparator circuit 540, and phase comparator circuit 560. Dummy delay circuit 600 receives adjusted clock signal 30 and dummy delay signal 570, and outputs intermediate data signal 510 and equalization delay signal 60. Driver circuit 520 receives intermediate data signal 510 and outputs dummy data signal 50. Level comparator circuit 540 receives dummy data signal 50 and outputs calibration signal 550. (The dummy data signal 50 may be two differential signals, or it may be one signal in which case the level comparator circuit 540 compares it with a reference signal such as 531b in FIG. 8.) Phase comparator circuit 560 receives calibration signal 550 and reference delay signal 40, and outputs dummy delay signal 570.

Dummy channel 500 produces equalization delay signal 60 to be an accurate delay target for the actual data channels because dummy channel 500 is configured similarly to the actual data channels. For example, driver circuit 520 is connected to have the same termination load (50e) as the driver circuits in the actual data channels. Level comparator 540 is similar to the level comparators in the actual data channels.

Figure 6:
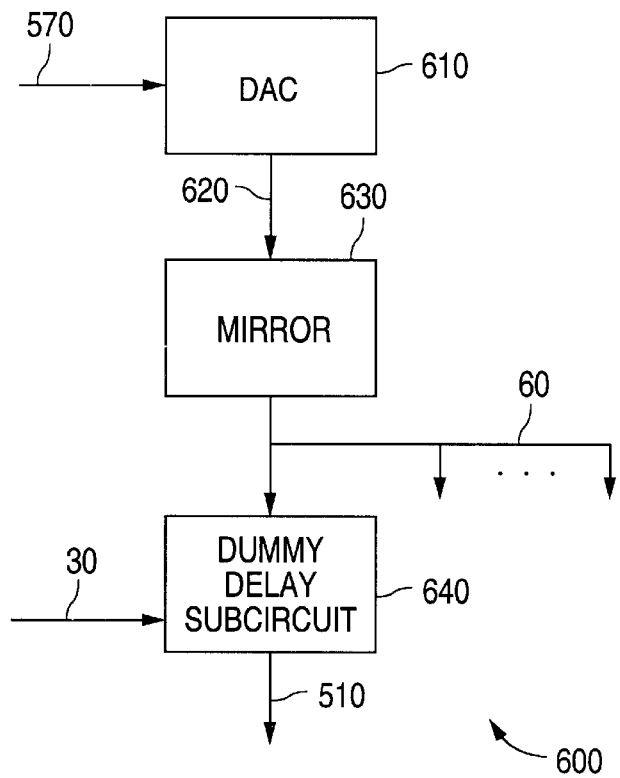
FIG. 6 is a block diagram of a dummy delay circuit in the dummy channel circuit.

FIG. 6 illustrates the components that make up dummy delay circuit 600. Circuit 600 includes digital-to-analog converter circuit 610, mirroring circuit 630, and dummy delay subcircuit 640. The DAC 610 receives dummy delay signal 570 (see FIG. 5) and generates analog dummy delay signal 620. Mirroring circuit 630 receives analog dummy delay signal 620 and generates a plurality of analog dummy delay signals as equalization delay signal 60. Dummy delay subcircuit 640 receives one of the plurality of signals 60 and adjusted clock signal 30 (see FIG. 1), and generates intermediate data signal 510.

In a preferred embodiment, phase comparator 560 (see FIG. 5) generates an 8-bit control word as dummy delay signal 570. The DAC 610 then converts the control word into a current signal. Mirroring circuit 630 mirrors this current to dummy delay subcircuit 640 and to the data channels 100. Mirroring circuit 630 generates 16 mirror currents, but more or less may be generated as desired. Thus, these mirror currents are replicas of the analog dummy delay signal 620. The DAC 610 preferably generates a bandgap reference current. Dummy delay subcircuit 640 may be implemented as a single-ended current starved buffer.

Figure 7:
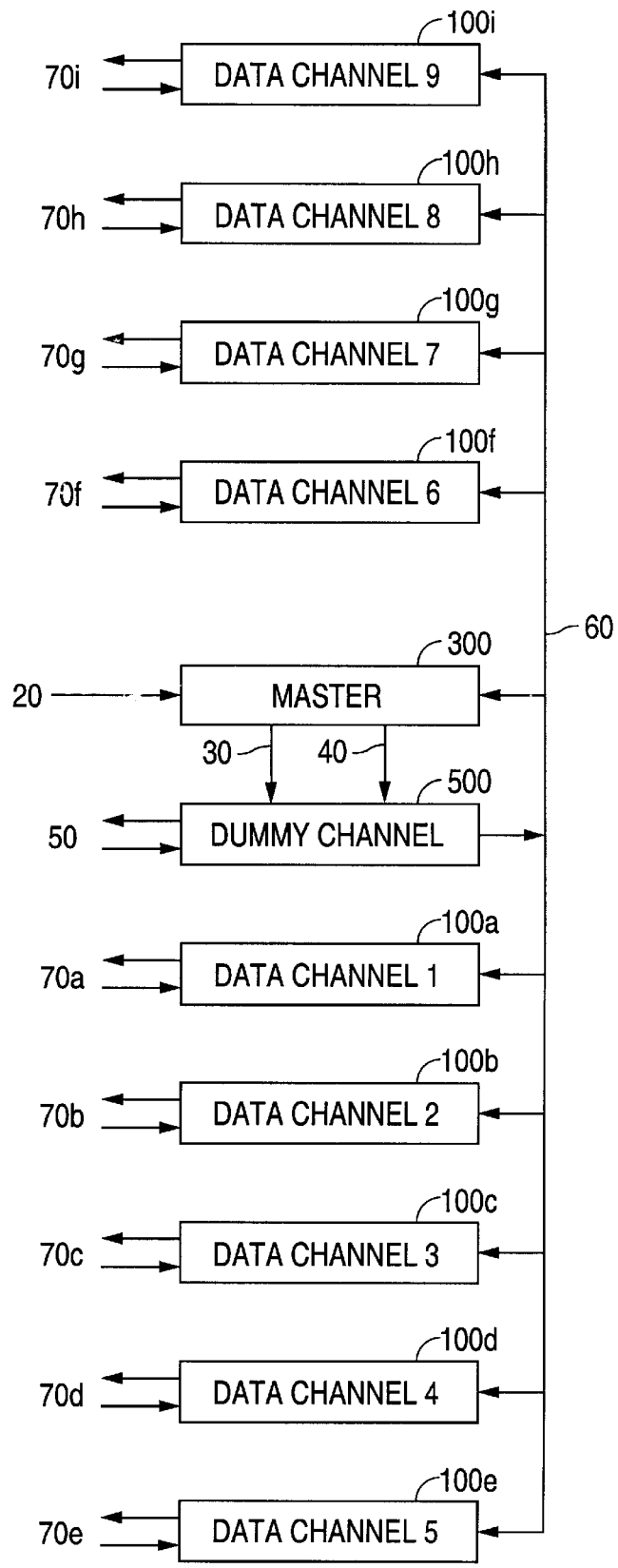
FIG. 7 is a block diagram of a part with nine data channels as implemented in a preferred embodiment of the present invention.

FIG. 7 shows that preferably nine data channels, plus the dummy channel 500, are implemented in each part. The data channels 100a–100i receive the equalization delay signal 60 and delay the data signals 70a–70i by the same amount. Placing the master circuit 300 and the dummy channel 500 in the middle of the part gives the smallest distance from the furthest slave delay stage, which will help with delay variation due to time-changing voltage and channel length mismatches. Preferably, three parts are implemented in the DP83890 Private Data Exchange from National Semiconductor Corp., Santa Clara, Calif.

Figure 8:
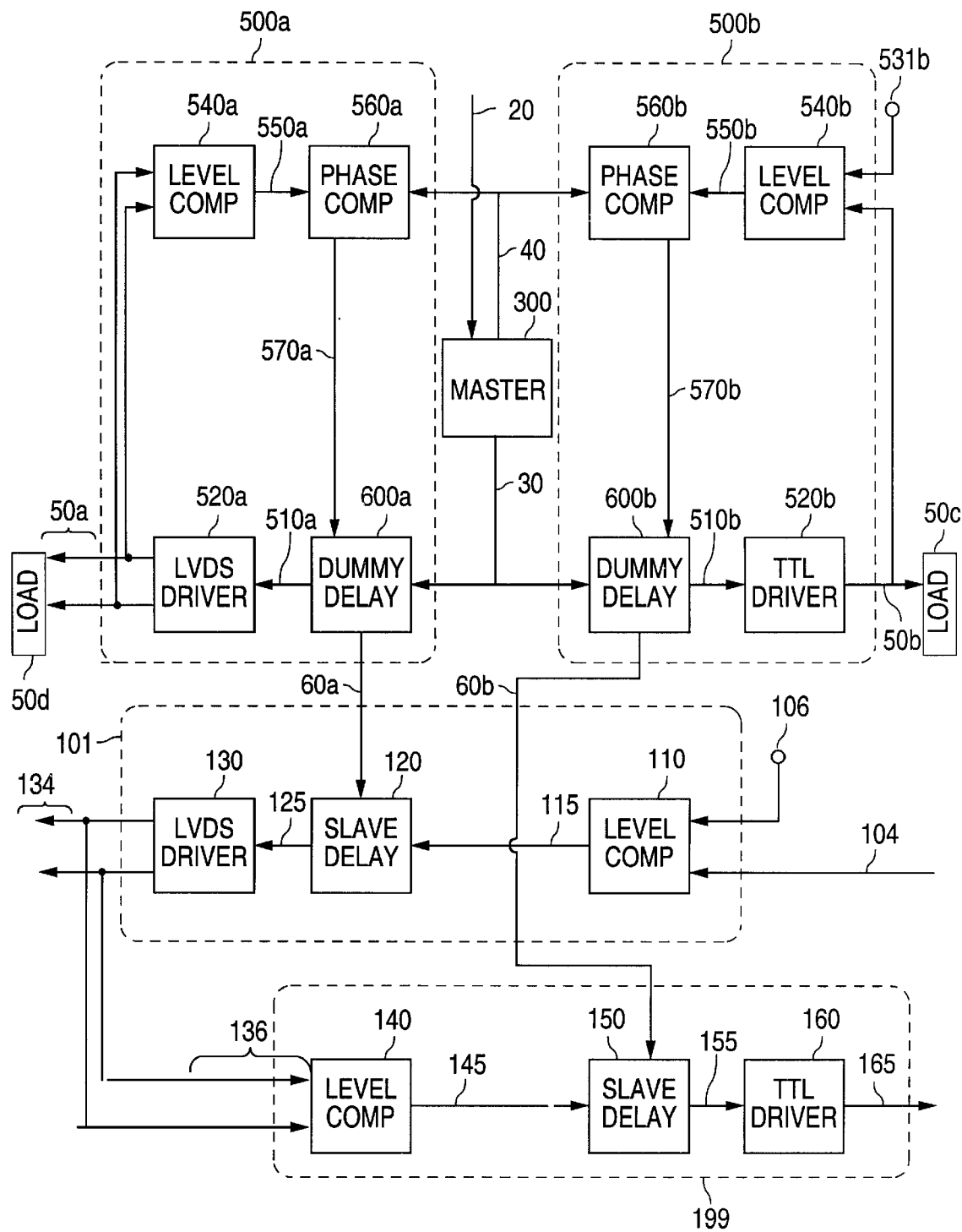
FIG. 8 is a block diagram of separate dummy transmission and dummy reception channels, and separate transmission and reception channels, in a preferred embodiment of the present invention.

FIG. 8 shows that preferably the delay of dummy transmission channel 500a is generated separately from the delay of dummy reception channel 500b. This separation allows the delays to be separately matched. (The dummy transmission components have the suffix 'a' appended to their numerical identifiers. The dummy reception components have the suffix 'b'.)

The driver in dummy transmission channel 500a is preferably low-voltage differential signaling (LVDS) driver 520a. The LVDS driver 520a is loaded with a termination load (50d) similar to that of LVDS driver 130.

Level comparator 540a is similar to level comparator 140. The driver in dummy reception channel 500b is preferably TTL driver 520b. Level comparator 540b receives a dummy voltage signal 531b as a reference signal in addition to dummy data signal 50b. Level comparator 540b is similar to level comparator 110. Preferably transmission channel 101 is separate from reception channel 199 as well.

Transmission level comparator 110 receives TTL input signal 104 and voltage signal 106, and outputs signal 115. Transmission slave delay 120 receives signal 115 and transmission equalization delay signal 60a, and outputs delayed signal 125. The LVDS driver 130 receives delayed signal 125 and transmits data signal 134 on the data channel.

On the reception side, reception level comparator 140 receives data signal 136 from the data channel, and outputs signal 145. Reception slave delay 150 receives signal 145 and reception equalization delay signal 60b, and outputs a delayed signal 155. The TTL driver 160 receives delayed signal 155 and outputs TTL output signal 165.

Preferably, voltage signal 106 and dummy voltage signal 531b are set the same at one-half of power supply voltage $V_{CC}$. Preferably dummy voltage signal 531b is tied to the negative input of level comparator 540b.

In dummy transmission channel 500a, level comparator 540a sees a load of phase comparator 560a, while in transmission data channel 101, level comparator 110 sees the input of slave delay 120. To ensure that the delay of data channel 101 matches the delay of dummy channel 500a, slave delay 120 has a phase comparator (not shown) similar to phase comparator 560a connected to its input; and comparator 540a has a delay stage (not shown) similar to slave delay 120 connected to its output. Thus, both level comparator 540a and level comparator 110 see the same capacitance, i.e., the input capacitance of a phase comparator and a delay stage.

In both the dummy transmission channel 500a and the data transmission channel 101, the LVDS driver sees the same on-chip load, i.e., either level comparator 140 or level comparator 540a. There will be a big difference in the capacitance seen at the data transmission channel LVDS driver 130 and the dummy transmission channel LVDS driver 520a. However, since these are terminated outputs, the bulk of the current will flow through a termination resistor at the frequency and edge rates contemplated for use with the present invention, so the delay will depend primarily on resistance, not on charging the cable capacitance.

In dummy receive channel 500b, level comparator 540b sees a load of phase comparator 560b, while in data receive channel 199, level comparator 140 sees the input to slave delay 150. This is fixed in the same manner as described above regarding data transmission channel 101. Slave delay 150 has a phase comparator (not shown) similar to phase comparator 560b driving its input, and level comparator 540b drives a delay stage (not shown) similar to slave delay 150.

The biggest mismatch for dummy receive channel 500b occurs when attempting to match a capacitor on the printed circuit board off TTL driver 520b with the capacitance of the printed circuit board and integrated circuit input capacitance. A preferred solution is to have input/output pins for the dummy channels 500a–b on the integrated circuit to which the LVDS driver 520a interfaces that have the sole purpose of loading the dummy channels. That way, the dummy receive channel 500b sees substantially the same capacitance (load 50c) as the data receive channel 199 on that printed circuit board. Similarly, the dummy transmission channel 500a is loaded (with load 50d) just like the transmission channel 101.

Reference delay signal 40 is taken off the same output on the subdelay circuit 430 that drives the next subdelay circuit of delay circuit 400 (see FIG. 4). To ensure a precise delay (e.g., exactly 10 ns), the other subdelay circuits 430 should preferably see a similar load; otherwise the more loaded subdelay circuit will introduce more delay, and the other subdelay circuits a little less to compensate. To overcome this concern, two phase comparator flip flops (not shown) load each subdelay circuit 430 except for the one from which is tapped the reference delay signal 40, which sees one phase comparator load in dummy transmission channel phase comparator 560a, and a second load in dummy receive channel phase comparator 560b (see FIG. 8).

The interconnect capacitance will differ, but this can be minimized by preferably laying out both dummy channels 500a and 500b close to master circuit 300.

Figure 9:
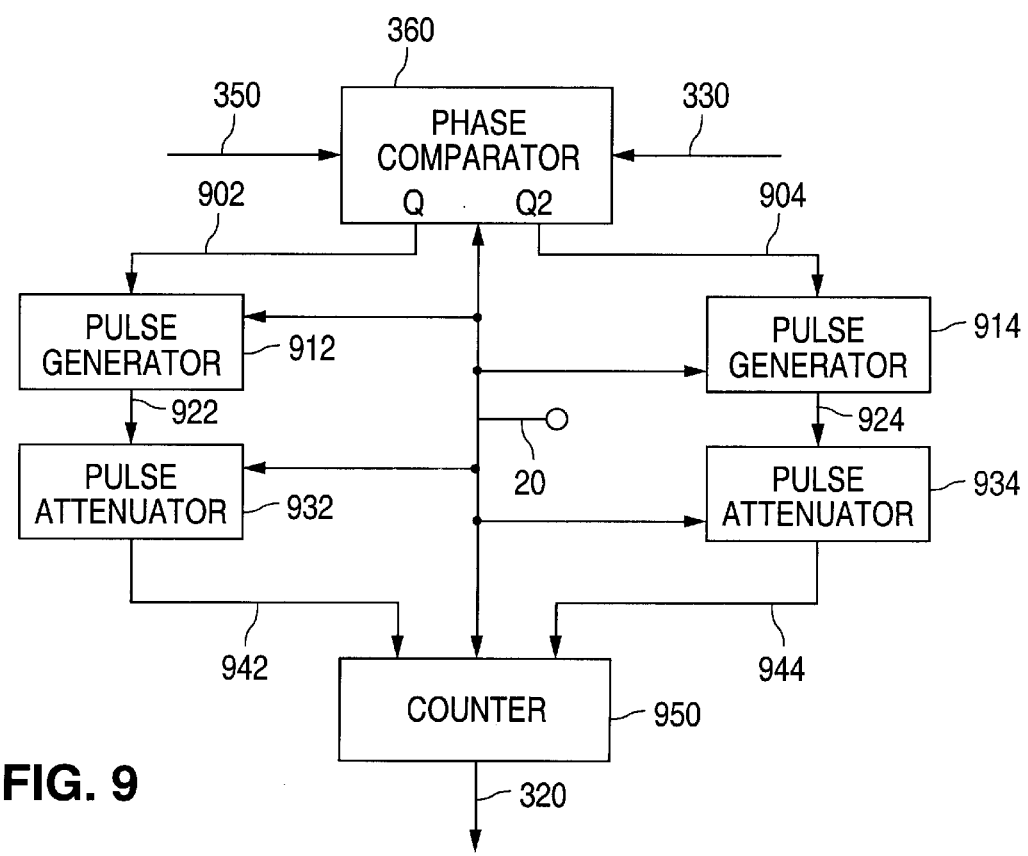
FIG. 9 is a block diagram of additional components in the master circuit.

FIG. 9 shows additional components of master circuit 300. Between phase comparator circuit 360 and delay circuit 400 (see FIG. 3A) are two pulse generator circuits 912 and 914, two pulse attenuator circuits 932 and 934, and counter circuit 950. Preferably phase comparator 360 is a flip flop with a short symmetric setup and hold window (e.g., under 50 ps). The Q output of phase comparator 360 provides down signal 902, and the QZ (inverse of Q) output provides the up signal 904. Down signal 902 is the input to pulse generator 912 which creates a pulse synchronous to reference clock signal 20 every time down is sensed true (i.e., the Q output is asserted) at a rising edge of delayed adjusted clock signal 330 input to phase comparator 360. Up signal 904 is the input to pulse generator 914 which creates a pulse synchronous to reference clock signal 20 every time up is sensed true (i.e., the QZ output is asserted) at a rising edge of the delayed adjusted clock signal 330 input to phase comparator 360. The output of pulse generator 912 is a pulse density modulated pulse stream 922 where the pulse density is proportional to an amount of samples where the delayed adjusted clock signal 330 input to phase comparator 360 lags the flip flop clock signal 350 input. The output of pulse generator 914 is a pulse density modulated pulse stream 924 where the pulse density is proportional to an amount of samples where the delayed adjusted clock signal 330 input to phase comparator 360 leads the flip flop clock signal 350 input.

Pulse stream 922 from pulse generator 912 is attenuated by pulse stream attenuator 932, while pulse stream 924 from pulse generator 934 is attenuated by pulse stream attenuator 934. A pulse stream attenuator is implemented as a programmable divider with a counter that counts input pulses and creates an output pulse upon counting a programmable number of input pulses. This allows programming the amount of proportional control for the loop. The outputs 942 and 944 of pulse stream attenuators 932 and 934 are input to counter 950. Counter 950 starts at a full count (i.e., minimum delay) and counts up or down in response to the pulse outputs 942 and 944 from pulse attenuators 932 and 934. A pulse input from pulse attenuator 932 will cause the count of counter 950 to increase by one, while a pulse input from pulse attenuator 934 will cause the count to decrease by one. The counter output is master delay signal 320, used to adjust the output of delay circuit 400 (see FIG. 3A). The components shown in FIG. 9 run off of the reference clock 20, and lead and lag errors are synchronized to such clock by pulse generators 912 and 914.

Referring again to FIG. 8, the delay locked loop operating point for one example embodiment should preferably be chosen such that the following requirements are met at any operating point at which a locked loop might result. First, slave delays 120 and 150 should introduce no data dependent jitter (DDJ) (i.e., the same delay should exist from zero to 50 MHz). Second, slave delays 120 and 150 should introduce no digital clock delay (DCD) (with a data signal having a frequency up to 50 MHz). Dither related to the least significant bit should be kept under 100 ps. Third, saturation voltages $V_{sat}$ for all current mirrors and delay stages should be kept below at least 400 mV, and the combined effect of worst case channel length mismatch and threshold voltage $V_t$ mismatch should result in a delay difference of under 100 ps. Fourth, direct current power supply rejection ratio should result in no more than an N% change in delay for an N% change in the power supply voltage $V_{DD}$.

The desire for small DDJ and DCD comes from the fact that we are using this to delay a data signal, so any distortion will deplete the total jitter budget.

The extremes of operating points contemplated for the circuit of the present invention is an operating temperature and voltage of −30° C. and 2.7 V for fast processes, and an operating temperature and voltage of −150° C. and 3.8 V for slow processes. The fastest delay is at the lowest voltage because it is a constant current delay stage, and a higher power supply voltage $V_{CC}$ means it needs to swing further with a constant rise time.

It is preferred that the delay through the comparator in the following two cases is as close as possible. The first case is when a LVDS signal (e.g., a few hundred millivolts at approximately 1.3 V) is applied to the positive and negative inputs zero crossing to the output crossing $V_{DD}/2$. The second case is when a signal with a high state equal to $V_{DD}$ and a low state equal to $V_{SS}$ is applied to the positive input, with the negative input tied to $V_{DD}/2$, with the output measured at the $V_{DD}/2$ crossing. Satisfaction of these two cases helps ensure that the delay through the comparator is equal for both large and small voltage swings.

This implies good common mode rejection ratio in that the output current from the differential stage should not depend on common mode voltage, and also implies high gain, in that the magnitude of the differential voltage should not affect the amount of current through the branch, i.e., operated well out of linear amplifier region. Specifically, high gain means that both small and large differential input signals will provide a relatively large amount of current between the sides of the differential input stage. That is, both these cases operate in the nonlinear region.

It is not critical that the delays be perfectly matched, provided that the variation in the delay mismatch is small over process variations (because temperature and $V_{CC}$ track on a given printed circuit board). This is because in this application, an exact 8 ns±200 ps channel delay is not required, provided that mismatch is no more than approximately 200 ps between all channels on a given printed circuit board.

It should be understood that various alternatives to the embodiments of the invention described herein may be employed in practicing the invention. It is intended that the following claims define the scope of the invention and that structures within the scope of these claims and their equivalents are covered thereby.

What is claimed is:

1. An apparatus for generating a delay control signal for use in equalizing propagation delay among parts of a transceiver, said parts having a plurality of channels, each channel being configured to receive said delay control signal, said apparatus comprising:

a master circuit configured to generate a reference delay signal and an adjusted clock signal such that the adjusted clock signal is a frequency-divided version of a reference clock signal, the reference delay signal is a delayed version of the adjusted clock signal, and the delay between the reference delay signal and the adjusted clock signal is determined by the reference clock signal; and a dummy channel circuit, coupled to said master circuit and including a driver having an output configured to be coupled to a dummy load and an input, wherein the driver is configured to assert a dummy data signal at the output in response to an intermediate data signal at the input when the output of the driver is coupled to the dummy load, the dummy channel circuit is configured to receive said adjusted clock signal and said reference delay signal, to generate the intermediate data signal by delaying the adjusted clock signal by a time determined by the delay control signal, and to generate said delay control signal in response to the reference delay signal.

2. An apparatus including a circuit for generating a signal for equalizing propagation delay among parts of a transceiver, said parts each having a plurality of channels, each channel being configured to receive said signal, comprising:

a master circuit configured to receive and lock to a reference clock signal and in accordance therewith generate a reference delay signal and an adjusted clock signal; and a dummy channel circuit, coupled to said master circuit, said dummy channel circuit configured to receive said adjusted clock signal, said reference delay signal, and a dummy data signal, and in accordance therewith generate an intermediate data signal, said dummy data signal and one or more control signals, wherein said one or more control signals correspond to a delay between said adjusted clock signal and said intermediate data signal, wherein said master circuit comprises:

a clock adjuster circuit configured to receive said reference clock signal and in accordance therewith generate said adjusted clock signal, wherein said adjusted clock signal differs in frequency from said reference clock signal;

a delay circuit, coupled to said clock adjuster circuit, said delay circuit configured to receive said adjusted clock signal and a master delay signal, and in accordance therewith generate a delayed adjusted clock signal and said reference delay signal;

a flip flop circuit, coupled to said clock adjuster circuit, said flip flop circuit configured to receive said reference clock signal and said adjusted clock signal, and in accordance therewith generate a flip flop clock signal being said adjusted clock signal delayed by said reference clock signal; and a phase comparator circuit, coupled to said delay circuit and said flip flop circuit, said phase comparator circuit configured to receive said delayed adjusted clock signal and said flip flop clock signal, and in accordance therewith generate said master delay signal.

3. The apparatus of claim 2, wherein:

said clock adjuster circuit is a clock divider circuit configured to receive said reference clock signal and in accordance therewith divide said reference clock signal in frequency.

4. The apparatus of claim 2, wherein:

said delay circuit comprises a plurality of similar subdelay circuits, each configured to receive said master delay signal, said plurality of similar subdelay circuits connected in series such that a first subdelay circuit receives said adjusted clock signal, a last subdelay circuit generates said delayed adjusted clock signal, and a subdelay circuit other than said last subdelay circuit generates said reference delay signal.

5. The apparatus of claim 2, wherein said delay circuit comprises:

a digital-to-analog converter circuit configured to receive said master delay signal and in accordance therewith generate an analog master delay signal; and one or more subdelay circuits configured to receive said adjusted clock signal and said analog master delay signal, and in accordance therewith generate a delayed adjusted clock signal and said reference delay signal.

6. An apparatus including a circuit for generating a signal for equalizing propagation delay among parts of a transceiver, said parts each having a plurality of channels, each channel being configured to receive said signal, comprising:

a master circuit configured to receive and lock to a reference clock signal and in accordance therewith generate a reference delay signal and an adjusted clock signal; and a dummy channel circuit, coupled to said master circuit, said dummy channel circuit configured to receive said adjusted clock signal, said reference delay signal, and a dummy data signal, and in accordance therewith generate an intermediate data signal, said dummy data signal and one or more control signals, wherein said one or more control signals correspond to a delay between said adjusted clock signal and said intermediate data signal, wherein said dummy channel circuit comprises:

a dummy transmission channel circuit configured to receive said adjusted clock signal, said reference delay signal and a dummy data transmission signal, and in accordance therewith generate an intermediate transmission data signal, said dummy data transmission signal and a transmission control signal, wherein said transmission control signal corresponds to a transmission delay between said adjusted clock signal and said intermediate transmission data signal; and a dummy receive channel circuit configured to receive said adjusted clock signal, said reference delay signal and a dummy data receive signal, and in accordance therewith generate an intermediate receive data signal, said dummy data receive signal and a receive control signal, wherein said receive control signal corresponds to a transmission delay between said adjusted clock signal and said intermediate receive data signal.

7. An apparatus including a circuit for generating a signal for equalizing propagation delay among parts of a transceiver, said parts each having a plurality of channels, each channel being configured to receive said signal, comprising:

a master circuit configured to receive and lock to a reference clock signal and in accordance therewith generate a reference delay signal and an adjusted clock signal; and a dummy channel circuit, coupled to said master circuit, said dummy channel circuit configured to receive said adjusted clock signal, said reference delay signal, and a dummy data signal, and in accordance therewith generate an intermediate data signal, said dummy data signal and one or more control signals, wherein said one or more control signals correspond to a delay between said adjusted clock signal and said intermediate data signal, wherein said dummy channel circuit comprises:

a dummy delay circuit configured to receive said adjusted clock signal and a dummy delay signal, and in accordance therewith generate said intermediate data signal and said one or more control signals;

a driver circuit, coupled to said dummy delay circuit, said driver circuit configured to receive said intermediate data signal and in accordance therewith generate said dummy data signal; and a phase comparator circuit, coupled to said dummy delay circuit and configured to receive said reference delay signal and a signal indicative of the phase of the dummy data signal, and in accordance therewith to generate said dummy delay signal.

8. The apparatus of claim 7, wherein said one or more control signals are at least two control signals, and said dummy delay circuit comprises:

a digital-to-analog converter circuit configured to receive said dummy delay signal and in accordance therewith generate an analog dummy delay signal;

a replication circuit, coupled to said digital-to-analog converter circuit, said replication circuit configured to receive said analog dummy delay signal and in accordance therewith generate a plurality of replica analog dummy delay signals as said control signals; and a dummy delay subcircuit, coupled to said replication circuit, configured to receive said adjusted clock signal and one of said plurality of replica analog dummy data signals, and in accordance therewith generate said intermediate data signal.

9. The apparatus of claim 7, wherein said driver circuit comprises a low voltage differential signaling driver circuit.

10. The apparatus of claim 7, wherein said driver circuit comprises a transistor-transistor logic driver circuit.

11. An apparatus including a circuit for generating a signal for equalizing propagation delay among parts of a transceiver, said parts each having a plurality of channels, each channel being configured to receive said signal, comprising:

a master circuit configured to receive and lock to a reference clock signal and in accordance therewith generate a reference delay signal and an adjusted clock signal;

a dummy channel circuit, coupled to said master circuit, said dummy channel circuit configured to receive said adjusted clock signal, said reference delay signal, and a dummy data signal, and in accordance therewith generate an intermediate data signal, said dummy data signal and one or more control signals, wherein said one or more control signals correspond to a delay between said adjusted clock signal and said intermediate data signal; and a plurality of data channel circuits coupled to said dummy channel circuit, each of said plurality of data channel circuits configured to receive an input data signal and said one or more control signals, and in accordance therewith generate an output data signal, wherein said one or more control signals control a delay between said input data signal and said output data signal.

12. A method of equalizing propagation delay among parts of a transceiver, said parts having a plurality of channels, each channel being configured to receive a delay control signal for setting a delay period, said method comprising the steps of:

generating a reference delay signal and an adjusted clock signal such that the adjusted clock signal is a frequency-divided version of a reference clock signal, the reference delay signal is a delayed version of the adjusted clock signal, and the delay between the reference delay signal and the adjusted clock signal is determined by the reference clock signal;

generating an intermediate data signal by delaying the adjusted clock signal by a time determined by a control signal, and asserting the intermediate data signal to an input of a driver having an output coupled to a dummy load, thereby generating a dummy data signal;

generating the control signal in response to the reference delay signal and the dummy data signal; and asserting the control signal to at least one of the channels, such that said control signal functions as the delay control signal for said at least one of the channels.

13. A method of equalizing propagation delay among parts of a transceiver, said parts each having a plurality of channels, each channel being configured to receive a signal for setting a delay period, said method comprising the steps of:

receiving and locking to a reference clock signal;

generating a reference delay signal and an adjusted clock signal, in accordance with said step of receiving and locking;

receiving said adjusted clock signal, said reference delay signal and a dummy data signal;

generating an intermediate data signal, said dummy data signal and one or more control signals, in accordance with said step of receiving said adjusted clock signal, wherein said one or more control signals correspond to a delay between said adjusted clock signal and said intermediate data signal, wherein said step of receiving and locking comprises:

receiving said adjusted clock signal and a master delay signal; and generating a delayed adjusted clock signal, in accordance with said step of receiving said adjusted clock signal.

14. The method of claim 13, wherein said step of generating a reference delay signal comprises:

generating said reference delay signal and said adjusted clock signal, in accordance with said step of generating said delayed adjusted clock signal.

15. A method of equalizing propagation delay among parts of a transceiver, said parts each having a plurality of channels, each channel being configured to receive a signal for setting a delay period, said method comprising the steps of:

receiving and locking to a reference clock signal;

generating a reference delay signal and an adjusted clock signal, in accordance with said step of receiving and locking;

receiving said adjusted clock signal, said reference delay signal and a dummy data signal;

generating an intermediate data signal, said dummy data signal and one or more control signals, in accordance with said step of receiving said adjusted clock signal, wherein said one or more control signals correspond to a delay between said adjusted clock signal and said intermediate data signal;

receiving a plurality of input data signals and said one or more control signals;

delaying said plurality of input data signals in accordance with said one or more control signals; and generating a plurality of output data signals in accordance with said step of delaying.

16. A method of equalizing propagation delay among parts of a transceiver, wherein the parts have a plurality of channels, each of the channels includes a channel driver configured to introduce an equalization delay to channel data in response to a delay signal asserted to the channel driver, said method comprising the steps of:

generating an adjusted clock signal in response to a reference clock signal, such that the adjusted clock signal is a frequency-divided version of the reference clock signal;

generating an intermediate data signal by delaying the adjusted clock signal by a time determined by a control signal, and asserting the intermediate data signal to an input of a driver having an output coupled to a dummy load, thereby generating a dummy data signal at the output;

generating the control signal in response to the adjusted clock signal and the dummy data signal; and asserting the control signal to the channel driver of each of the channels, such that said control signal functions as the delay signal for each said channel driver.

17. The method of claim 16, wherein each of the channels has a channel load, and the dummy load at least substantially matches each said channel load.

18. A method of equalizing propagation delay among parts of a transceiver, wherein the parts have a plurality of channels, each of the channels includes a receiver circuit configured to introduce an equalization delay to received channel data in response to a delay signal asserted to the channel driver, said method comprising the steps of:

generating an adjusted clock signal in response to a reference clock signal, such that the adjusted clock signal is a frequency-divided version of the reference clock signal;

generating an intermediate data signal by delaying the adjusted clock signal by a time determined by a control signal, and asserting the intermediate data signal to an input of a driver having an output coupled to a dummy load, thereby generating a dummy data signal at the output;

generating the control signal in response to the adjusted clock signal and the dummy data signal; and asserting the control signal to the receiver circuit of each of the channels, such that said control signal functions as the delay signal for each said receiver circuit.

19. The method of claim 18, wherein each of the channels has a channel load, and the dummy load at least substantially matches each said channel load.

20. An apparatus for equalizing propagation delay among parts of a transceiver, said apparatus comprising:

a plurality of channels, each of the channels including a channel driver configured to introduce an equalization delay to channel data in response to a delay control signal asserted to the channel driver;

a master circuit configured to generate a reference delay signal and an adjusted clock signal such that the adjusted clock signal is a frequency-divided version of a reference clock signal, the reference delay signal is a delayed version of the adjusted clock signal, and the delay between the reference delay signal and the adjusted clock signal is determined by the reference clock signal; and a dummy channel circuit, coupled to said master circuit and including a driver having an output configured to be coupled to a dummy load and an input, wherein the driver is configured to assert a dummy data signal at the output in response to an intermediate data signal at the input when the output of the driver is coupled to the dummy load, the dummy channel circuit is configured to receive the adjusted clock signal and the reference delay signal, to generate the intermediate data signal by delaying the adjusted clock signal by a time determined by a control signal, to generate the control signal in response to the reference delay signal and the dummy data signal, and to assert the control signal to the channel driver of each of the channels such that said control signal functions as the delay control signal for each said channel driver.

21. An apparatus for equalizing propagation delay among parts of a transceiver, comprising:

a plurality of channels, each of the channels including a channel driver configured to introduce an equalization delay to channel data in response to a delay signal asserted to the channel driver;

a master circuit configured to generate an adjusted clock signal in response to a reference clock signal, such that the adjusted clock signal is a frequency-divided version of the reference clock signal; and a dummy channel circuit, coupled to the master circuit and including a driver having an output configured to be coupled to a dummy load and an input, wherein the driver is configured to assert a dummy data signal at the output in response to an intermediate data signal at the input when the output of the driver is coupled to the dummy load, and wherein the dummy channel circuit is configured to receive the adjusted clock signal, to generate an intermediate data signal by delaying the adjusted clock-signal by a time determined by a control signal, to assert the intermediate data signal to the input of the driver, to generate the control signal in response to the adjusted clock signal and the dummy data signal, and to assert the control signal to the channel driver of each of the channels, such that said control signal functions as the delay signal for each said channel driver.

22. The apparatus of claim 21, also including the dummy load coupled to the output of the driver, and wherein each of the channels has a channel load, and the dummy load at least substantially matches each said channel load.

23. An apparatus for equalizing propagation delay among parts of a transceiver, comprising:

a plurality of channels, each of the channels including a receiver circuit configured to introduce an equalization delay to received channel data in response to a delay signal asserted to the receiver circuit;

a master circuit configured to generate an adjusted clock signal in response to a reference clock signal, such that the adjusted clock signal is a frequency-divided version of the reference clock signal; and a dummy channel circuit, coupled to the master circuit and including a driver having an output configured to be coupled to a dummy load and an input, wherein the driver is configured to assert a dummy data signal in response to an intermediate data signal at the input when the output of the driver is coupled to the dummy load, and wherein the dummy channel circuit is configured to receive the adjusted clock signal, to generate an intermediate data signal by delaying the adjusted clock signal by a time determined by a control signal, to assert the intermediate data signal to the input of the driver, to generate the control signal in response to the adjusted clock signal and the dummy data signal, and to assert the control signal to the receiver circuit of each of the channels, such that said control signal functions as the delay signal for each said receiver circuit.

24. The apparatus of claim 23, also including the dummy load coupled to the output of the driver, and wherein each of the channels has a channel load, and the dummy load at least substantially matches each said channel load.

* * * * *